(12) United States Patent
Choi et al.

(10) Patent No.: US 7,375,351 B2
(45) Date of Patent: May 20, 2008

(54) MICRO-COLUMN ELECTRON BEAM APPARATUS

(75) Inventors: Sang Kuk Choi, Daejeon (KR); Dae Jun Kim, Daejeon (KR); Jin Woo Jeong, Daegu (KR); Dae Yong Kim, Daejeon (KR)

(73) Assignee: Electronics and Telecommunications Research Instutute, Daejeon (KR)

( * ) Notice: Subject to any disclaimer, the term of this patent is extended or adjusted under 35 U.S.C. 154(b) by 260 days.

(21) Appl. No.: 11/257,244

(22) Filed: Oct. 24, 2005

(65) Prior Publication Data

US 2006/0151716 A1 Jul. 13, 2006

(30) Foreign Application Priority Data

Dec. 16, 2004 (KR) .................. 10-2004-0107222

(51) Int. Cl.
*G21G 5/00* (2006.01)
(52) U.S. Cl. .................. 250/492.1; 250/492.2; 310/309; 310/328
(58) Field of Classification Search .......... 250/492.1
See application file for complete search history.

(56) References Cited

U.S. PATENT DOCUMENTS 6,023,060 A * 2/2000 Chang et al. .............. 250/310
6,555,829 B1 * 4/2003 Spallas et al. ............ 250/492.2

FOREIGN PATENT DOCUMENTS

JP 2001 330425 11/2001
JP 2003 215014 7/2003

* cited by examiner

*Primary Examiner*—David A. Vanore
*Assistant Examiner*—Phillip A. Johnston
(74) *Attorney, Agent, or Firm*—Ladas & Parry LLP (57) ABSTRACT

Provided is a micro-column electron beam apparatus including: a base; an electron lens bracket on which an electron lens module can be fixed, mounted in a central portion of the base; an electron beam source tip module vertically disposed on the electron lens module; a pan spring plate stage module that is mounted over the base, supports the electron beam source tip module at a central portion thereof, and includes a three-coupling pan spring plate portion including first through third spring units that are coupled to the electron beam source tip module in three directions on a plane perpendicular to the vertical axis, which vertically passes the center of the electron beam source tip module, to elastically support the electron beam source tip module in three directions; a first piezoelectric actuator coupled to the pan spring plate stage module to move the electron beam source tip module along a first axis perpendicular to the vertical axis; and a second piezoelectric actuator coupled to the pan spring plate stage module to move the electron beam source tip module along a second axis perpendicular to the vertical axis and the first axis.

11 Claims, 8 Drawing Sheets

FIG. 10

MICRO-COLUMN ELECTRON BEAM APPARATUS

BACKGROUND OF THE INVENTION

This application claims the priority of Korean Patent Application No. 10-2004-0107222, filed on Dec. 16, 2004, in the Korean Intellectual Property Office, the disclosure of which is incorporated herein in its entirety by reference.

1. Field of the Invention

The present invention relates to a micro-column electron beam apparatus with a reduced size (20 mm×20 mm×30 mm) that can be mounted in an ultra high vacuum chamber.

2. Description of the Related Art

Efforts have been made world wide to miniaturize micro-column electron beam apparatuses. Micro-column electron beam apparatuses are applied to scanning tunneling microscopes, which align an emission tip, which is an electron beam source essential to all electron beam apparatuses, along an optical axis and operate the emission tip in a field emission mode. Also, micro-column electron beam apparatuses are used to ensure a high throughput of electron beam lithography systems.

Figure 1:
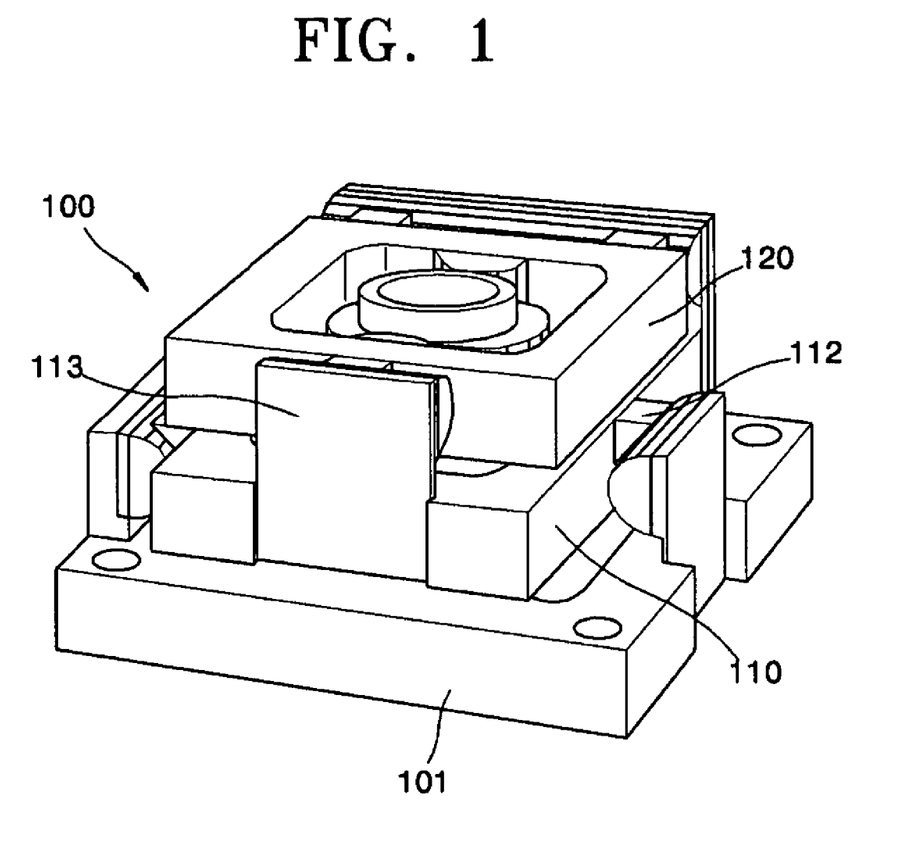
FIG. 1 is a perspective view of a conventional micro-column electron beam apparatus.
Figure 2:
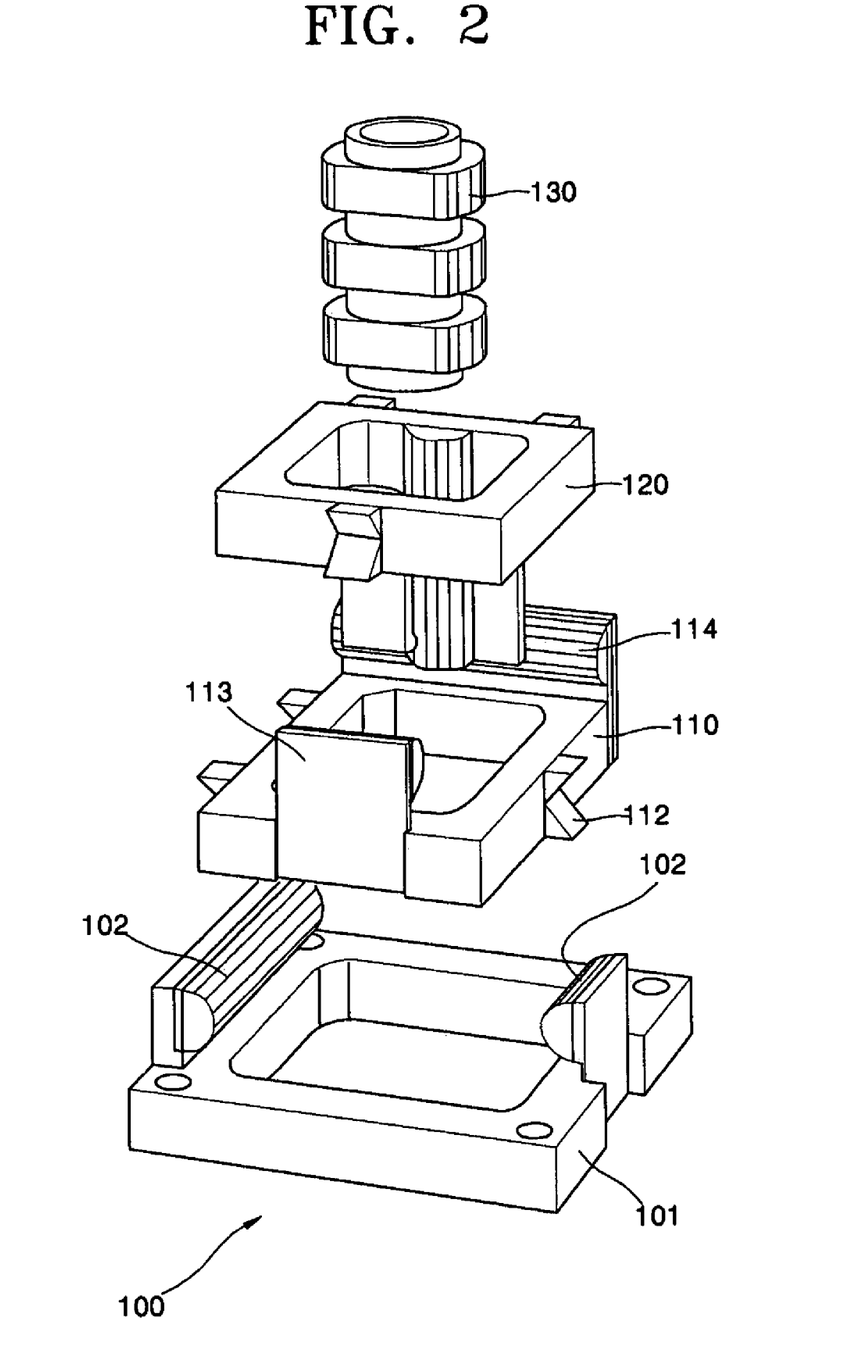
FIG. 2 is an exploded perspective view of the conventional micro-column electron beam apparatus of FIG. 1.

FIGS. 1 and 2 are respectively a perspective view and an exploded perspective view of a conventional micro-column electron beam apparatus, illustrating a micro-column stage that allows an electron beam source tip module to be aligned in the X, Y, and Z axes.

A stage module 100 employed in the conventional micro-column electron beam apparatus functions as a three-axis positioner. The stage module 100 includes four stainless steel stages, that is, a base frame 101, an Y-axis slider stage 110, an X-axis slider stage 120, and a Z-axis slider stage 130.

However, this structure is instrumentally complex and physically requires various additional functions, and each additional function causes operational problems. Also, a slow motion of a piezoelectric (PZT) actuator 102 results in friction between the stages, and a fast motion of the PZT actuator 102 causes the stages to slip from desired positions due to their inertia. In general, the PZT actuator 102 moves the stages by approximately 10 µm at a voltage of 100 V.

To make the moving stages sliding, both a rigid bearing and a smooth sliding surface should be used. Steel and sapphire, which have a smooth sliding surface in a general stage environment, may be used for the smooth sliding bearing. There may be used a guide bearing which has V-grooves 112 of several millimeters attached in the moving base frame 101 at an angle of 90 degrees. Ball sliding bearings may be placed in the V-grooves 112 to act as guiding bearings.

In the conventional stage module, a great force is applied to contact surfaces so that the V-grooves 114 over a half rod 114 can slide and reduce friction generated in the contact surfaces. However, this structure has disadvantages of poor alignment caused when the V-grooves 112 are mechanically processed. In addition, as the contact surfaces increase, a pressure higher than the ball bearings is produced.

A spring of the base frame 101 for pressing the moving stages is a leaf spring 113, not a coil spring. The leaf spring 113 is fairly stiff in a direction perpendicular to a direction in which it is flexible.

SUMMARY OF THE INVENTION

The present invention provides a micro-column electron beam apparatus which is structurally simple to permit integrated packaging and reliably align a micro electron lens module of an electron beam source tip module.

According to an aspect of the present invention, there is provided a micro-column electron beam apparatus comprising: a base; an electron lens bracket on which an electron lens module can be fixed, mounted in a central portion of the base; an electron beam source tip module vertically disposed on the electron lens module; a pan spring plate stage module that is mounted over the base, supports the electron beam source tip module at a central portion thereof, and includes a three-coupling pan spring plate portion including first through third spring units that are coupled to the electron beam source tip module in three directions on a plane perpendicular to the vertical axis, which vertically passes the center of the electron beam source tip module, to elastically support the electron beam source tip module in three directions; a first piezoelectric actuator coupled to the pan spring plate stage module to move the electron beam source tip module along a first axis perpendicular to the vertical axis; and a second piezoelectric actuator coupled to the pan spring plate stage module to move the electron beam source tip module along a second axis perpendicular to the vertical axis and the first axis.

The first spring unit may be disposed along the first axis, the second spring unit may be disposed along the second axis, and the third spring unit may be spaced 135 degrees apart from each of the first and second spring units.

The first piezoelectric actuator may be disposed on a first straight line parallel to the first axis, and the pan spring plate stage module may include a first support member that is disposed between the first axis and the first straight line, closer to the first straight line, and a first lever that contacts both the first piezoelectric actuator and the electron beam source tip module and rotates about the first support member, wherein, when the first piezoelectric actuator is lengthened and moved, the electron beam source tip module is moved a distance equal to the distance the fist piezoelectric actuator is lengthened and moved times the ratio of the distance between the first axis and the first support member to the distance between the first support member and the first straight line, wherein the second piezoelectric actuator is disposed on a second straight line parallel to the second axis, and the pan spring plate stage module includes a second support member that is disposed between the second axis and the second straight line, closer to the second straight line, and a second lever that contacts both the second piezoelectric actuator and the electron beam source tip module and rotates about the second support member, wherein, when the second piezoelectric actuator is lengthened and moved, the electron beam source tip module is moved a distance equal to the distance the second piezoelectric actuator is lengthened and moved times the ratio of the distance between the second axis and the second support member to the distance between the second support member and the second straight line.

A portion of the first lever for pushing the electron beam source tip module may be vertically divided into two portions and the first spring unit may be disposed between the vertically divided portions of the first lever, and a portion of the second lever for pushing the electron beam source tip module may be vertically divided into two portions and the second spring unit may be disposed between the vertically divided portions of the second lever.

The micro-column electron beam apparatus may further comprise a metal ball disposed between the first piezoelectric actuator and the first lever and a metal ball between the second piezoelectric actuator and the second lever to transfer a force through a spot contact.

The micro-column electron beam apparatus may further comprise: a third piezoelectric actuator coupled to the pan spring plate stage module and vertically separated from the electron beam source tip module; a third lever having a first end connected to the third piezoelectric actuator and a second end coupled to the electron beam source tip module; and a hinge unit disposed closer to the first end of the third lever than the second end of the third lever, wherein, when the third piezoelectric actuator is moved, the electron beam source tip module is moved along the vertical axis a distance equal to the distance the third piezoelectric actuator is moved times the ratio of the distance between the first end of the hinge unit and the hinge axis to the distance between the hinge axis and the second end of the hinge unit.

The second end of the third lever may have a through-hole through which the electron beam source tip module can pass.

The pan spring plate stage module may include at least one vertically perforated wire path through which a plurality of wires connected to the electron lens module and the first and second piezoelectric actuators can pass.

The micro-column electron beam apparatus may further comprise a land board that is mounted on an upper portion of the pan spring plate stage module and has a plurality of upwardly protruding electrical connectors to which the plurality of wires passing through the wire path are connected.

The micro-column electron beam apparatus may further comprise heat pipe coupling units disposed on the land board to couple heat pipes for exhausting heat generated in the electron beam source tip module.

BRIEF DESCRIPTION OF THE DRAWINGS

The above and other features and advantages of the present invention will become more apparent by describing in detail exemplary embodiments thereof with reference to the attached drawings in which.

DETAILED DESCRIPTION OF THE INVENTION

The present invention will now be described more fully with reference to the accompanying drawings, in which preferred embodiments of the invention are shown.

Figure 3:
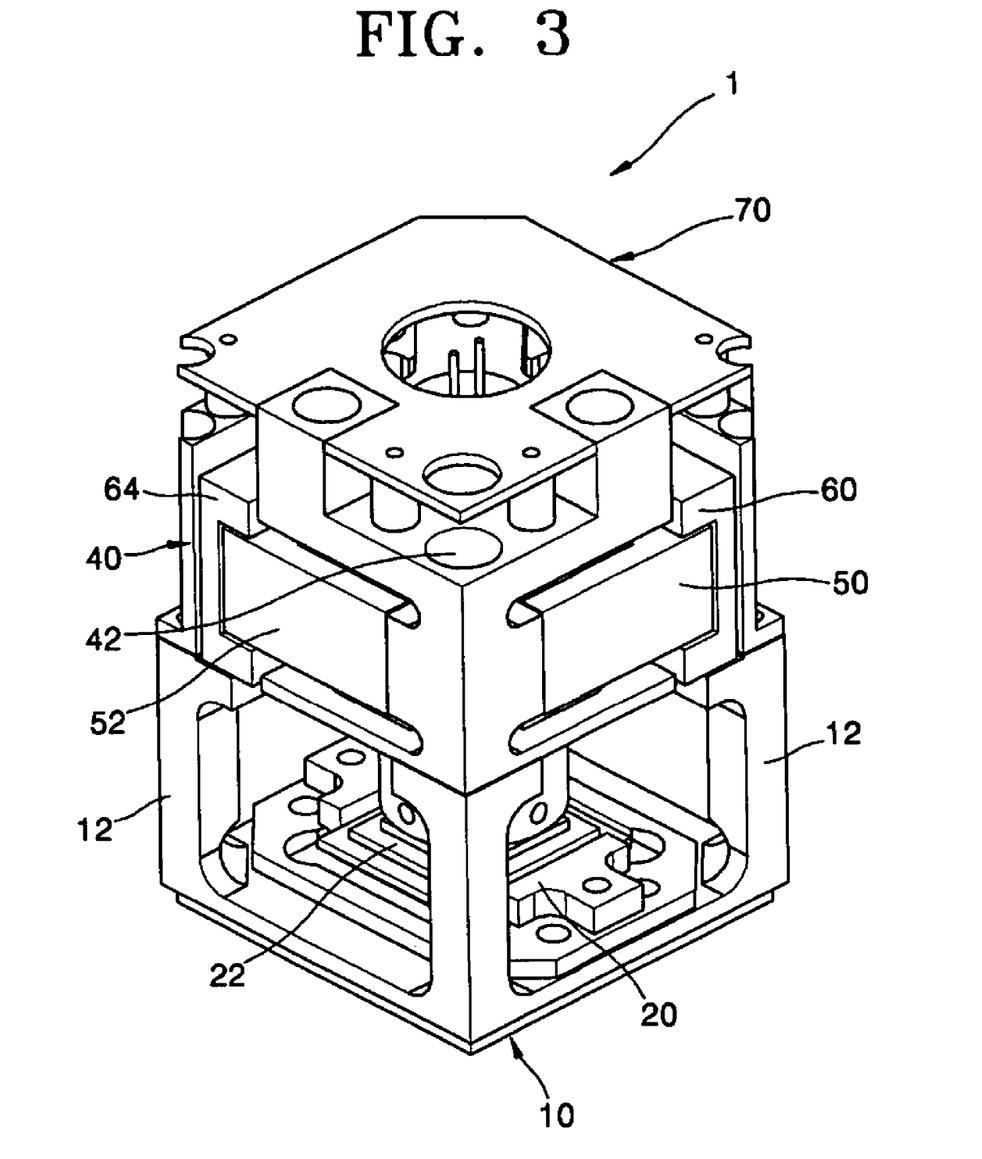
FIG. 3 is a perspective view of a micro-column electron beam apparatus according to an embodiment of the present invention.

FIG. 3 is a perspective view of a micro-column electron beam apparatus according to an embodiment of the present invention. Referring to FIG. 3, the micro-column electron beam apparatus 1 includes a base 10, an electron lens bracket 20, an electron beam source tip module 30, a pan spring plate stage module 40, first, second, and third piezoelectric (PZT) actuators 50, 52, and 54, first, second, and third levers 60, 64, and 68, and a land board 70.

Figure 4:
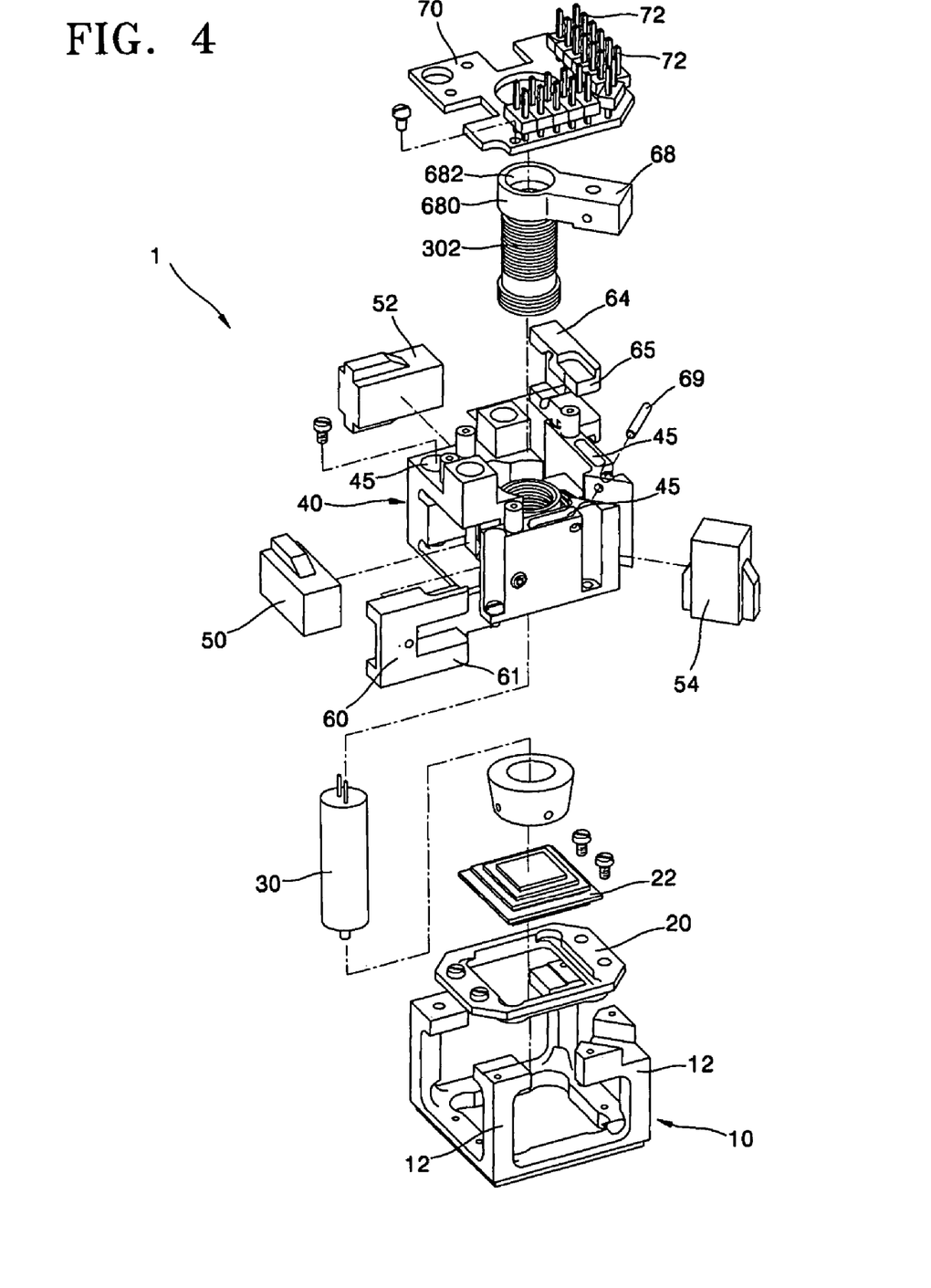
FIG. 4 is an exploded perspective view illustrating a state where the micro-column electron beam apparatus of FIG. 3 is rotated 90 degrees clockwise.

FIG. 4 is an exploded perspective view illustrating a state where the micro-column electron beam apparatus is rotated 90 degrees clockwise. Referring to FIG. 4, the base 10 has fixed stays 12 formed at four corners. Accordingly, the base 10 is separated from the bottom of the electron lens bracket 20 by the height of the fixed stays 12. Also, an inner space is formed by the fixed stays 12, and the bottom surface of the base 10 has a through-hole.

The electron lens bracket 20 is centered over the hole in the bottom surface of the base 10 and fixed to the base 10. An electron lens module 22 is horizontally fixed to the electron lens bracket 20. The electron lens module 22 is made of silicon or glass. The electron lens module 22 is formed by stacking and aligning an object lens module for focusing a beam, a single or double deflection system, and an electrostatic source lens module for extracting and accelerating electrons. A tip of the electron lens module 22 is aligned along an optical axis to be aligned with a source tip module operated in a field emission mode.

The electron beam source tip module 30 is longitudinally disposed on the electron lens module 22. The electron beam source tip module 30 is coupled to the pan spring plate stage module 40 by a holder 302. So, it can move horizontally and vertically.

Figure 5:
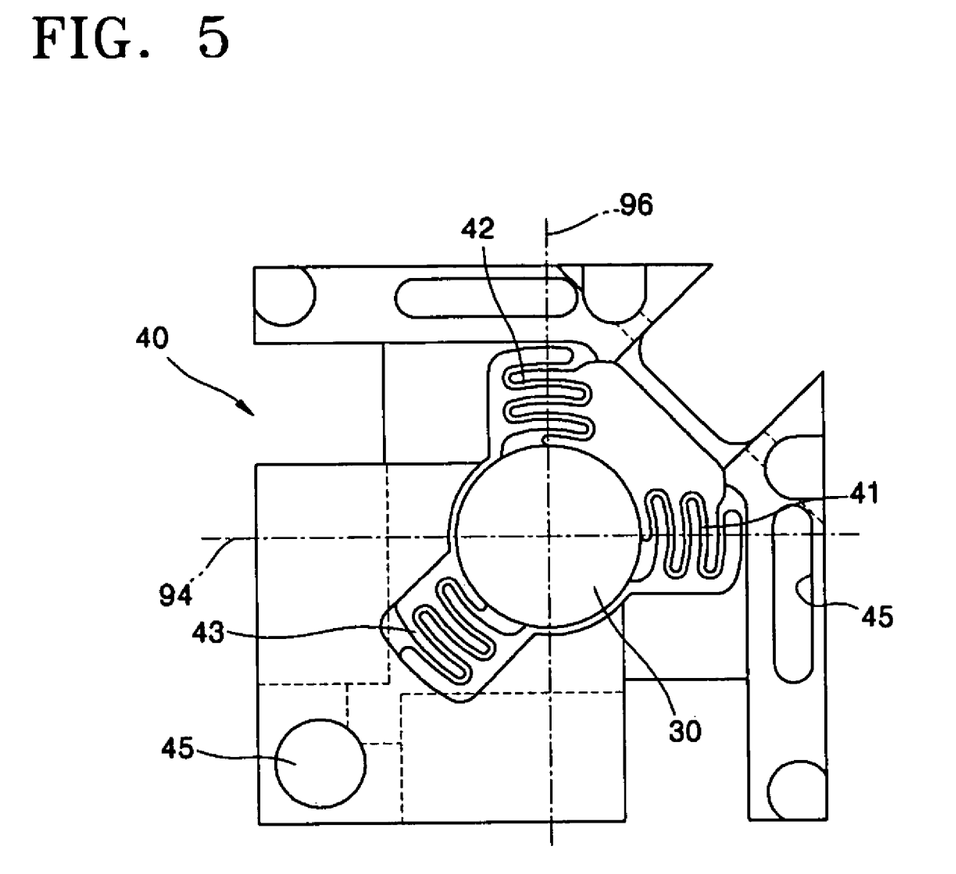
FIG. 5 is a plan view of a pan spring plate stage module of the micro-column electron beam apparatus of FIG. 3.
Figure 6:
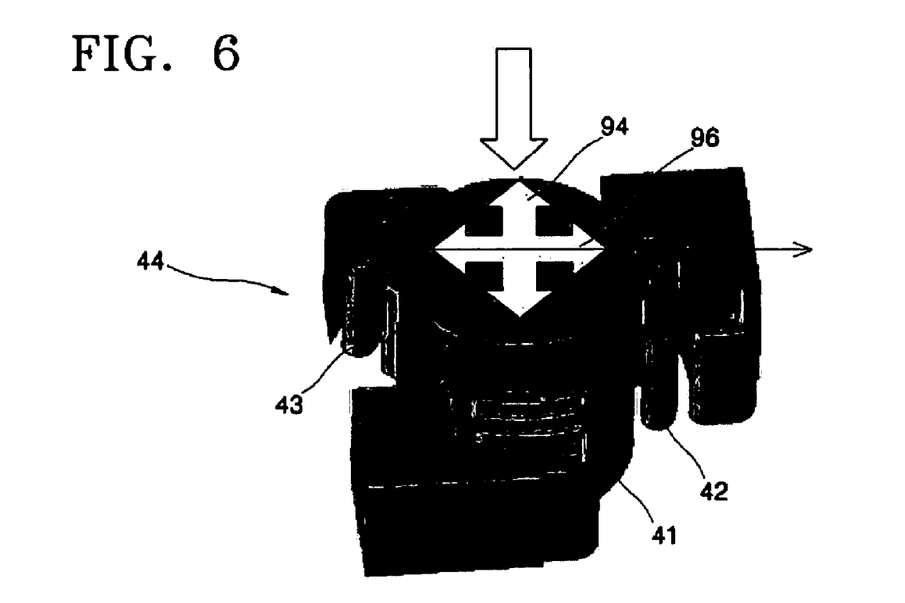
FIG. 6 is a three-dimensional view of a three-coupling pan spring plate unit, which can move in three directions, of the micro-column electron beam apparatus of FIG. 3.
Figure 7:
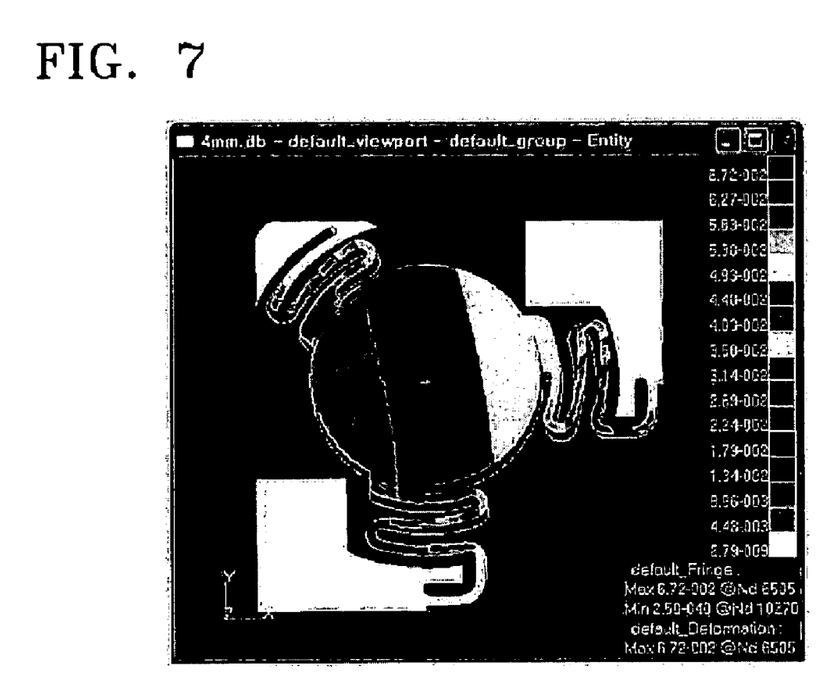
FIG. 7 is a plan view exemplarily analyzing the maximum movement of the three-coupling pan spring plate unit of FIG. 6 in three directions.

The pan spring plate stage module 40 is mounted over the base 10, and is made of STS 314. The pan spring plate stage module 40 supports the electron beam source tip module 30 at a central portion thereof. The pan spring plate stage module 40 has a three-coupling pan spring plate unit 44 formed at the center thereof as shown in FIG. 6. The three-coupling pan spring plate unit 44 may be integrally formed with the pan spring plate stage module 40. As shown in FIG. 6, the three-coupling pan spring plate unit 44 includes first, second, and third spring units 41, 42, and 43 such that the three springs 41 through 43 can be moved vertically and can also be moved along first and second axes 94 and 96 perpendicular to each other and to the vertical direction. Here, FIGS. 6 and 7 illustrate a state where the three-coupling pan spring plate unit 44 is rotated 90 degrees clockwise to the three-coupling pan spring plate unit 44 shown in FIG. 5.

The first spring unit 41 is disposed on the first axis 94, and the second spring unit 42 is disposed on the second axis 96. The third spring unit 43 is spaced 135 degrees apart from each of the first and second spring units 41 and 42. The three-directional spring units 41, 42, and 43 prevent distortion. The electron beam source tip module 30 is vertically coupled to a place where the three spring units 41, 42, and 43 meet. Accordingly, the first through third spring units 41 through 43 can elastically support the electron beam source tip module 30 so that the electron beam source tip module 30 can be moved in three perpendicular directions.

The pan spring plate stage module 40 has vertically perforated wire paths 45 through which a plurality of wires (not shown) connected to the electron lens module 22 and the first, second, and third PZT actuators 50, 52, and 54 can pass. Accordingly, 22 or less enamel copper wires connected to the electron lens module 22 and wires connected to the PZT actuators 50, 52, and 54 can be connected to electrical connectors of the land board 70 disposed at the top of the apparatus 1 without being exposed to the outside of the apparatus 1. Accordingly, the entire size of the apparatus 1 is reduced, thereby contributing to the miniaturization of the apparatus 1.

The first PZT actuator 50 and the second PZT actuator 52 are coupled to the pan spring plate stage module 40, and respectively move the electron beam source tip module 30 along the first axis 94 and the second axis 96.

In the present embodiment, the pan spring plate stage module 40 includes the first lever 60 and the second lever 64 to increase the movement of each actuator, thereby increasing the movement of the electron beam source tip module 30.

Figure 8:
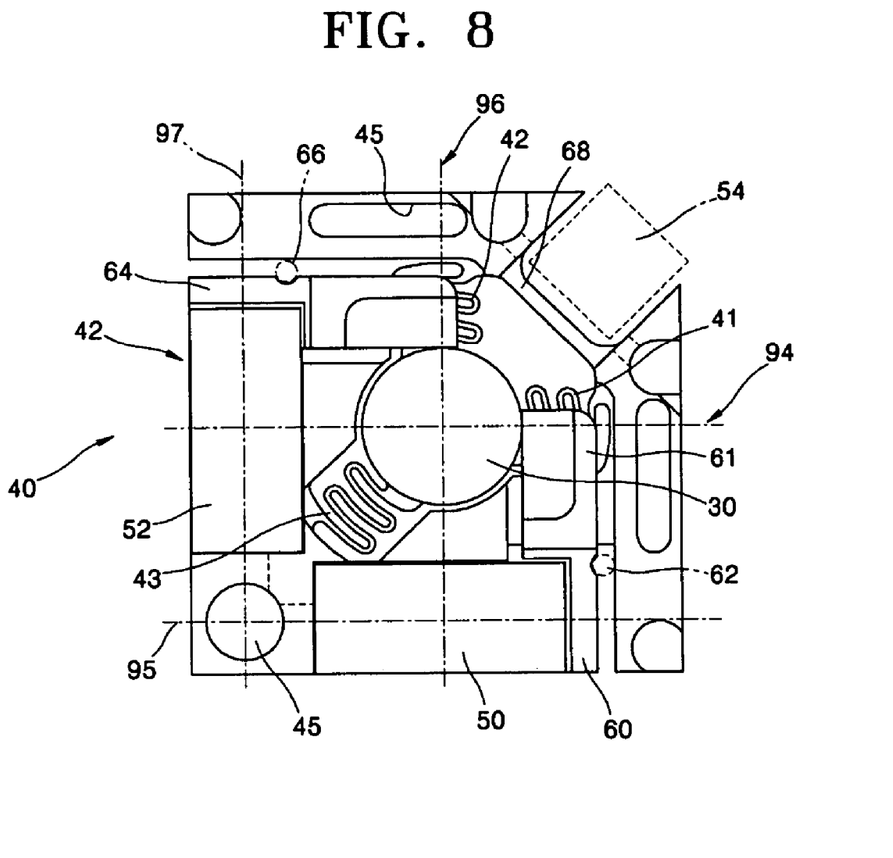
FIGS. 8 and 9 are respectively a plan view and a front view of the pan spring plate stage module of FIG. 5 with first through third piezoelectric (PZT) actuators thereon.
Figure 9:
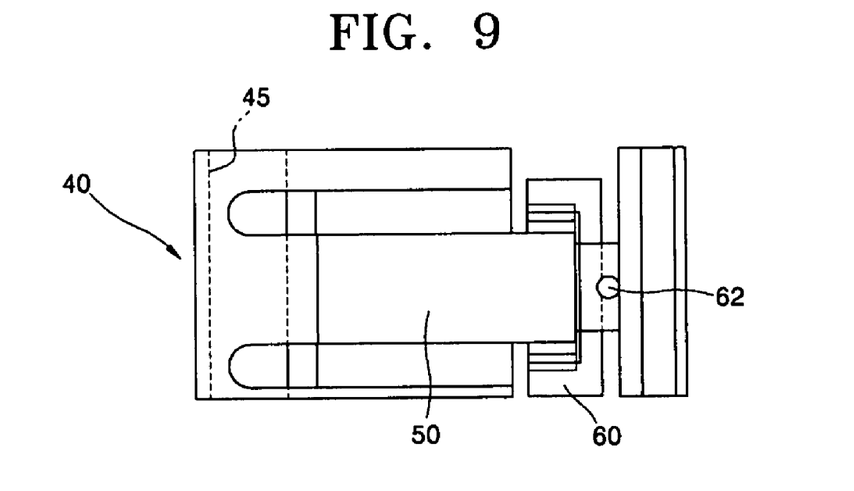

FIG. 8 is a plan view of the pan spring plate stage module. Referring to FIG. 8, the first PZT actuator 50 extends along a first straight line 95 that is parallel to the first axis 94. A first support member 62 is a cylindrical pin disposed between the first axis 94 and the first straight line 95, closer to the first straight line 95. The first lever 60 contacts both the first PZT actuator 50 and the electron beam source tip module 30 and rotates about the first support member 62.

In this structure, a method of moving the electron beam source tip module 30 along the first axis 94 will now be explained. If the first PZT actuator 50 is turned on, the first PZT actuator 50 is elongated, thereby pushing one end of the first lever 60. Then, according to the lever rule, the distance the other end of the first lever 60 is moved along the first axis 94 is equal to the distance the end of the first lever 60 pushed by the first PZT actuator 50 is moved times the ratio of the distance between the first axis 94 and the first support member 62 to the distance between the first support member 62 and the first straight line 95. Here, the movement of the first PZT actuator 50 may be increased fivefold.

The other end of the first lever 60, that is, a portion 61 of the first lever 60 pushing the electron beam source tip module 30, is vertically divided into two portions. The first spring unit 41 is disposed between the vertically divided portions. Accordingly, the first lever 60 with the first spring unit 41 therein can uniformly push the electron beam source tip module 30.

The second PZT actuator 52 extends along a second straight line 97 that is parallel to the second axis 96, and a second support member 66 is disposed between the second axis 96 and the second straight line 97, closer to the second straight line 9. The second lever 64 contacts both the second PZT actuator 52 and the electron beam source tip module 30.

As the second PZT actuator 52 is lengthened and moved, the movement is magnified five times by the second lever 64 to move the electron beam source tip module 30 along the second axis 96. The end of the second lever 64 for pushing the electron beam surface tip module 30 is divided into two portions, and the second spring unit 42 is disposed between the divided portions of the second lever 64.

Meanwhile, in the present embodiment, the micro-column electron beam apparatus 1 includes a third PZT actuator 54, a third lever 68, and a hinge unit 69.

The third PZT actuator 54 is coupled to the pan spring plate stage module 40 as shown in FIG. 4, and is separated vertically from the electron beam source tip module 30. The third PZT actuator 54 vertically moves the electron beam source tip module 30.

The third lever 68 has one end connected to an upper end of the third PZT actuator 54 and another end 682 coupled to the electron beam source tip module 30. In the present embodiment, the other end 682 of the third lever 68 has a through-hole 680 through which the electron beam source tip module 30 can pass. The through-hole 680 does not permit the holder 302 of the electron beam source tip module 30 to pass therethrough, such that the other end 682 of the third lever 68 applies a force to an upper end of the holder 302.

The hinge unit 69 is a pin passing through the pan spring plate stage module 40 and the third lever 68. The hinge unit 69 is disposed on the one end of the lever 68 connected to the third PZT actuator 54. If the third PZT actuator 54 is turned on, the third PZT actuator 54 is elongated and moved, thereby pushing the end of the third lever 68 connected to the third PZT actuator 54. The third lever 68 is rotated about the pin-shaped hinge unit 69, and the other end 682 of the third lever 68 moves the electron beam source tip module 30 downwardly. Here, the distance the electron beam source tip module 30 is moved along the vertical axis is equal to the distance to the third PZT actuator 54 is moved times the ratio of the distance between the end of the third lever 68 connected to the third PZT actuator 54 and the hinge axis 69 to the distance between the hinge axis 69 and the other end 682 of the third lever 68. Here, the movement of the third PZT actuator 54 may be increased fivefold.

FIG. 7 depicts a computer simulation results illustrating expected movements of the three spring units 41, 42, and 43 included in the three-coupling pan spring plate unit 44.

Although not shown, a metal ball may be disposed between contact surfaces of the first PZT actuator 50 and the first lever 60 to transfer a force through a spot contact. In this case, irrespective of the angle or area of the contact surfaces, the first PZT actuator 50 can uniformly push the first lever 60. Metal balls may also be disposed between the second PZT actuator 52 and the second lever 64 and between the third PZT actuator 54 and the third lever 68.

The land board 70 is mounted on the upper portion of the pan spring plate stage module 40. As depicted in FIG. 4, a plurality of electrical connectors 72 are disposed on the land board 70. However, the electrical connectors 72 are not shown in FIG. 3.

The electrical connectors 72 are mounted on a plate member that forms the land board 70, and the wires passing through the wire paths 45 are electrically connected to the electrical connectors 72. Specifically, the electrical connectors 72 pass through the plate member such that the internal wires of the apparatus 1 are connected to the portions of the electrical connectors below the plate member and electric plugs are connected to the portions of the electrical connectors 72 above the plate member.

Heat pipe coupling units 74 (see FIG. 10) may be disposed on the land board 70 to couple heat pipes (not shown) for transferring heat generated in the electron beam source tip module 30 outside of the apparatus 1. The temperature of the apparatus 1 can be increased to approximately 1000 to 1800 K due to the heat generated in the electron beam source tip module 30. If the high heat is not properly dissipated, the heat is conducted to components inside the apparatus 1, thereby adversely affecting the lifespan and operation of the components. Accordingly, heat pipes with high heat transfer capacity may be used to dissipate the heat. The apparatus 1 uses the heat pipe coupling units 74 to couple such heat pipes.

Figure 10:
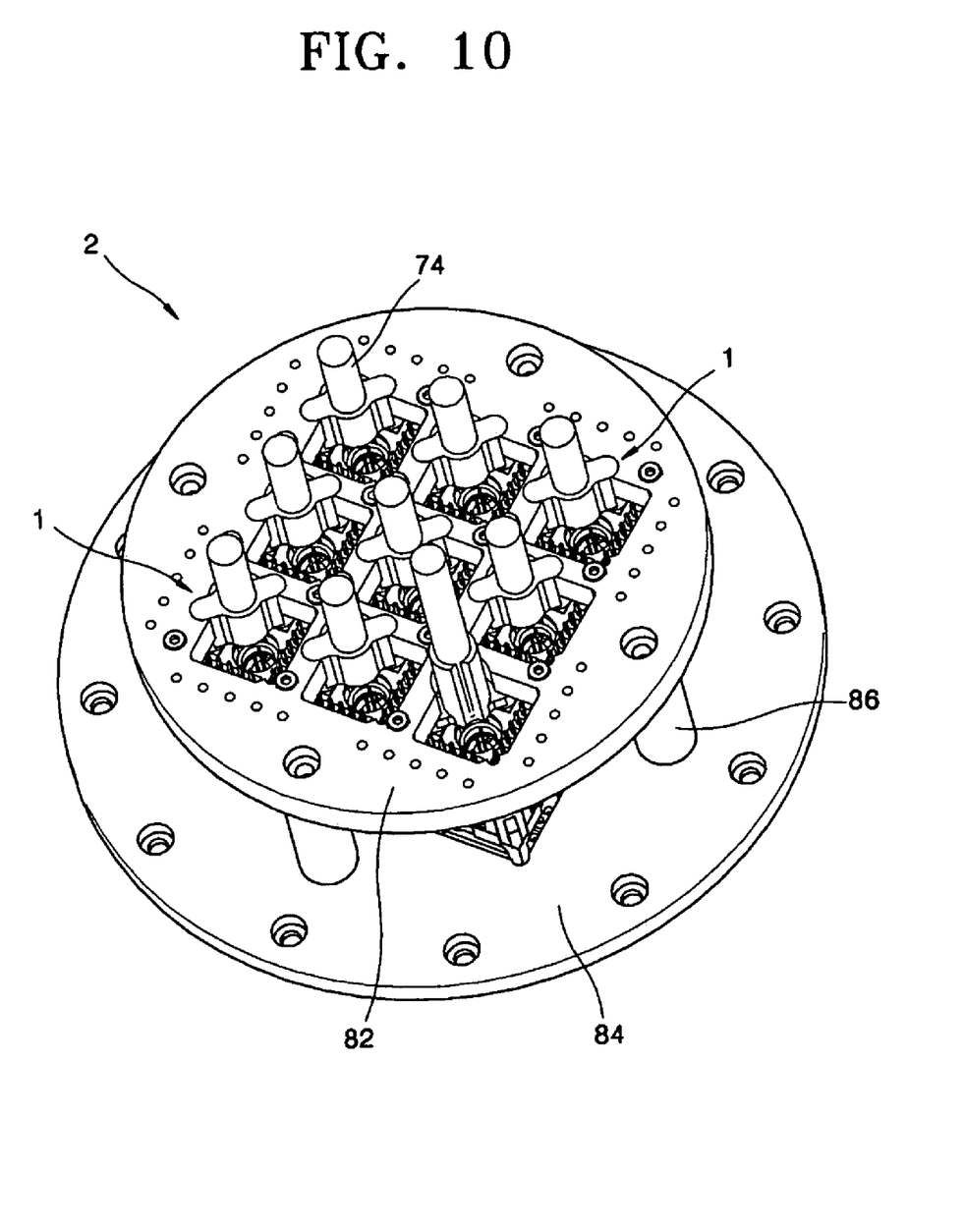
FIG. 10 is a perspective view of a micro-column electron beam apparatus assembly according to an embodiment of the present invention.

FIG. 10 is a perspective view of a micro-column electron beam apparatus assembly 2 employing a plurality of micro-column electron beam apparatuses 1 according to an embodiment of the present invention. Referring to FIG. 10, nine micro-column electron beam apparatuses are assembled in a 3×3 array formed on a plane. To this end, the micro-column electron beam apparatus assembly 2 includes an upper flange 82, a lower flange 84, and assembly stays 86.

The upper flange 82 and the lower flange 84 are vertically separated from each other and are fixed to each other by the four assembly stays 86. Through-holes are formed in the upper flange 82 so that upper portions of the micro-column electron beam apparatuses 1 can be exposed upwardly. Through-holes are also formed in the lower flange 84 so that lower portions of the micro-column electron beam apparatuses 1 can be exposed downwardly.

As described above, since the micro-column electron beam apparatus uses the three-coupling pan spring plate unit and the PZT actuators the structure of the apparatus is simple and thus the entire size of the apparatus can be reduced, and the electron beam source tip module can be controlled with a high precision in three directions. Additionally, if the levers are additionally used in the micro-column electron beam apparatus, the movement of the PZT actuators can be increased. Furthermore, if the heat pipe coupling units for coupling the heat pipes are used, the temperature of the apparatus can be reduced as desired.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A micro-column electron beam apparatus comprising:
   a base;
   an electron lens bracket having an electron lens module mounted thereon in a central portion of the base;
   an electron beam source tip module vertically disposed on the electron lens module;
   a pan spring plate stage module mounted over the base;
   a three-coupling pan spring plate portion comprising a first, second, and third spring units disposed within the pan spring plate stage module,
      wherein the spring units of the three-coupling pan spring plate portion are perpendicularly coupled to the sides of the vertically disposed electron beam source tip module to elastically support the electron beam source tip module and allow movement of the electron beam source tip module in three orthogonal directions;
   a first piezoelectric actuator coupled to the pan spring plate stage module to move the electron beam source tip module along a first axis perpendicular to the vertical axis; and
   a second piezoelectric actuator coupled to the pan spring plate stage module to move the electron beam source tip module along a second axis perpendicular to the vertical axis and the first axis.

2. The micro-column electron beam apparatus of claim 1, wherein the first spring unit is disposed along the first axis, the second spring unit is disposed along the second axis, and the third spring unit is spaced 135 degrees apart from each of the first and second spring units.

3. The micro-column electron beam apparatus of claim 1, wherein the first piezoelectric actuator is disposed on a first straight line parallel to the first axis, and the pan spring plate stage module includes a first support member that is disposed between the first axis and the first straight line, closer to the first straight line, and a first lever that contacts both the first piezoelectric actuator and the electron beam source tip module and rotates about the first support member,
   wherein, when the first piezoelectric actuator is lengthened and moved, the electron beam source tip module is moved a distance equal to the distance the first piezoelectric actuator is lengthened and moved times the ratio of the distance between the first axis and the first support member to the distance between the first support member and the first straight line,
   wherein the second piezoelectric actuator is disposed on a second straight line parallel to the second axis, and the pan spring plate stage module includes a second support member that is disposed between the second axis and the second straight line, closer to the second straight line, and a second lever that contacts both the second piezoelectric actuator and the electron beam source tip module and rotates about the second support member,
   wherein, when the second piezoelectric actuator is lengthened and moved, the electron beam source tip module is moved a distance equal to the distance the second piezoelectric actuator is lengthened and moved times the ratio of the distance between the second axis and the second support member to the distance between the second support member and the second straight line.

4. The micro-column electron beam apparatus of claim 3, wherein a portion of the first lever for pushing the electron beam source tip module is vertically divided into two portions and the first spring unit is disposed between the vertically divided portions of the first lever, and a portion of the second lever for pushing the electron beam source tip module is vertically divided into two portions and the second spring unit is disposed between the vertically divided portions of the second lever.

5. The micro-column electron beam apparatus of claim 3, further comprising a metal ball disposed between the first piezoelectric actuator and the first lever and a metal ball between the second piezoelectric actuator and the second lever to transfer a force through a spot contact.

6. The micro-column electron beam apparatus of claim 1, further comprising:
   a third piezoelectric actuator coupled to the pan spring plate stage module and vertically separated from the electron beam source tip module;
   a third lever having a first end connected to the third piezoelectric actuator and a second end coupled to the electron beam source tip module; and
   a hinge unit disposed closer to the first end of the third lever than the second end of the third lever,
   wherein, when the third piezoelectric actuator is moved, the electron beam source tip module is moved along the vertical axis a distance equal to the distance the third piezoelectric actuator is moved times the ratio of the distance between the first end of the hinge unit and the hinge axis to the distance between the hinge axis and the second end of the hinge unit.

7. The micro-column electron beam apparatus of claim 6, wherein the second end of the third lever has a throughhole through which the electron beam source tip module passes.

8. The micro-column electron beam apparatus of claim 1, wherein the pan spring plate stage module includes at least one vertically perforated wire path through which a plurality of wires connected to the electron lens module and the first and second piezoelectric actuators pass.

9. The micro-column electron beam apparatus of claim 8, further comprising a land board that is mounted on an upper portion of the pan spring plate stage module and has a plurality of upwardly protruding electrical connectors to which the plurality of wires passing through the wire path are connected.

10. The micro-column electron beam apparatus of claim 9, further comprising heat pipe coupling units disposed on the land board to couple heat pipes for exhausting heat generated in the electron beam source tip module.

11. A micro-column electron beam apparatus assembly comprising:
- a plurality of micro-column electron beam apparatuses of any one of claims 1 through 10 horizontally disposed in a multi-array pattern;
- an upper flange; and
- a lower flange disposed under the upper flange and parallel to the upper flange, and fixed to the upper flange by a plurality of assembly stays, wherein upper and lower portions of each of the micro-column electron beam apparatuses are respectively fixed to the upper flange and the lower flange.

* * * * *